United States Patent [19]

Rudd

[11] 4,117,419

[45] Sep. 26, 1978

[54] FREQUENCY MEASURING SYSTEM EMPLOYING AN AUTO-CORRELATION FUNCTION FREQUENCY CONTROL LOOP

[75] Inventor: Michael Jefferson Rudd, Concord, Mass.

[73] Assignee: Bolt Beranek and Newman Inc., Cambridge, Mass.

[21] Appl. No.: 813,507

[22] Filed: Jul. 7, 1977

[51] Int. Cl.² .............................................. H03B 3/04
[52] U.S. Cl. ................................. 331/1 A; 324/83 FE;
331/17; 331/23; 331/27
[58] Field of Search ...................... 331/1 A, 17, 23, 25,
331/27; 329/50, 122, 145; 235/150.53, 181;
324/83 FE

[56] References Cited

U.S. PATENT DOCUMENTS

| | | | |
|---|---|---|---|
| 3,351,868 | 11/1967 | Farrow | 331/17 |
| 3,819,919 | 6/1974 | McGunigle | 235/151.34 |
| 4,055,814 | 10/1977 | Abraham et al. | 331/1 A |

OTHER PUBLICATIONS

Ludington, "Digital Circuit Detects Frequency-Modulated Signals", Electronic Design, Apr. 12, 1976, p. 126.

Primary Examiner—Siegfried H. Grimm
Attorney, Agent, or Firm—Kenway & Jenney

[57] ABSTRACT

In the frequency measuring system disclosed herein, a control signal is generated which is related to the value of function of the input signal for a selectable delay time. The average value of the control signal is employed to control the clock rate of a shift register which is used to obtain a delayed version of the input signal, the input signal being digitized and fed into the shift register. This feedback path forms a servo-loop which adjusts the clocking rate of the shift register in correspondence with the frequency of any coherent component in the input signal, even though the input signal may be a composite comprising many random components.

17 Claims, 4 Drawing Figures

FREQUENCY MEASURING SYSTEM EMPLOYING AN AUTO-CORRELATION FUNCTION FREQUENCY CONTROL LOOP

BACKGROUND OF THE INVENTION

The present invention relates to a frequency measuring system and more particularly to such a system which will measure the frequency of a relatively coherent component in a composite input signal even though the component is of smaller magnitude than random noise components in the composite input signal and is itself subject to phase reversals and phase jitter. The Government has rights in this invention pursuant to Contract No. F33615-76-C-3051 awarded by the United States Air Force.

Myriad prior art systems have been proposed for extracting from a composite input signal a desired signal which may be buried in background noise of greater amplitude than the desired signal itself. Among the techniques previously employed are included selective and adaptive filtering and, increasingly, phase-locked loops of various types. Phase-locked loops have found particular application where it is desired to measure the frequency of the desired component of a composite input signal. Phase-lock loop systems are particularly adapted to such applications in that the gain of the tracking loop and its band width can be easily adjusted to fit the requirements of the particular situation. Further, once the system has locked onto the desired component, rejection of unwanted signal components is quite good since the desired signal component is, in effect, coherently detected, the local oscillator controlling the detection process being locked in phase to the desired input signal component.

Phase-lock loop systems, however, do have certain limitations, among them that they can be relatively easily disturbed in operation by abrupt phase reversals or phase jitter in the desired component of the input signal. Likewise, such a system may, on occasion, fail to obtain initial lock on the input signal, so that it never has the chance to apply its substantial tracking power. Conventional phase-locked loop techniques are typically limited to relatively narrow capture ranges since the signal to noise rejection capability is proportionally degraded as the capture range is expanded.

There are, however, various situations in which it is desired to measure the input frequency of a component input signal where the desired input signal component may be subject to occasionally phase reversals or severe phase jitter. For example, the signal processor of the present invention was developed for use in conjunction with an optical convolution airspeed sensor. This particular instrument utilizes an optical grating system to detect the rate at which vortices are shed by a heated element in a wind stream. The optical instrument itself is described in greater detail in a report No. AFFDL-TR-76-132 entitled Development of a Prototype Optical Convolution Airspeed Sensor filed in conjunction with the previously identified contract. Signal processing applications of this general character are also to be found in various laser Doppler velocimeters though the signals are generated in a substantially higher frequency domain.

Among the several objects of the present invention may be noted the provision of a frequency measuring system which will measure the frequency of one component of a composite input signal; the provision of such a system which is relatively insensitive to phase reversals or phase jitter in the desired component; the provision of such a system which easily initially acquires an input signal within the frequency band of interest; the provision of such a system which is highly reliable and which is of relatively simple and inexpensive construction. Other objects and features will be in part apparent and in part pointed out hereinafter.

SUMMARY OF THE INVENTION

In terms of the electronic components used and general organization, the frequency measuring system of the present invention is in some ways similar to both various types of phase-lock loops known in the prior art and also various cross-correlator systems which operate upon a pair of input signals and have been employed in various systems to determine fluid flow velocity by cross-correlating upstream and downstream signals. Systems employing phase-lock loops are described in U.S. Pat. Nos. 3,351,868; 3,602,834; 3,878,473; 3,361,985; 3,840,821. The device shown in the Farrow U.S. Pat. No. 3,351,868 is of particular interest in that it employs many components similar to those employed in the system of the present invention. Examples of correlation systems are found in U.S. Pat. Nos. 3,819,919; 3,760,355; 3,483,549; and 3,777,133. The McGunigle U.S. Pat. No. 3,819,919 is of particular interest, again for the reason that may of the components of the system are similar to those employed in the present invention. In the various cross-correlation methods of fluid flow velocity measurement, the operation of the variable speed shift register is typically adjusted so as to balance or match the effective time it takes for the fluid flow to progress from one input transducer to the next, the output function from the correlator with varying delay being thus a typical bell-shaped curve. This may be contrasted with the typical autocorrelation function, which comprises multiple zero crossings and reversals of value, i.e., when referenced to an input signal having no d.c. component.

As indicated previously, the frequency measuring apparatus of the present invention operates by generating a control signal the value of which depends at any given instance upon the value of the autocorrelation function of the input signal for a selected delay time. The value of the delay time is then automatically adjusted to produce a desired average value of the autocorrelation dependent control signal.

Briefly, frequency determining apparatus in accordance with the present invention is adapted for application to a composite input signal comprising components, e.g., noise, in addition to the component whose frequency is to be measured. The input signal is initially hard limited to obtain a binary input signal, and this binary input signal is entered into a serial input, parallel output shift register which may be clocked at a preselectable frequency so as to obtain from the shift register a delayed version of the binary input signal, the delay being a function of the clocking frequency. Means, such as an exclusive OR gate, are provided for correlating the input signal with its delayed version so as to obtain a coincidence signal which corresponds to the autocorrelation function of the input signal for a particular value of delay. This coincidence signal is filtered to obtain an average correlation value signal. A voltage controlled oscillator is provided for clocking the shift register and the average value signal is applied to the oscillator for controlling its frequency, thereby to vary the autocorrelation delay. The control is applied in a sense tending to adjust the delay time to a value corresponding to a zero crossing in the autocorrelation function of the input signal. Accordingly, the frequency of operation of the oscillator will automatically be adjusted to correspond to the frequency of a consistent component in the input signal, while remaining relatively insensitive to the phase of that component.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
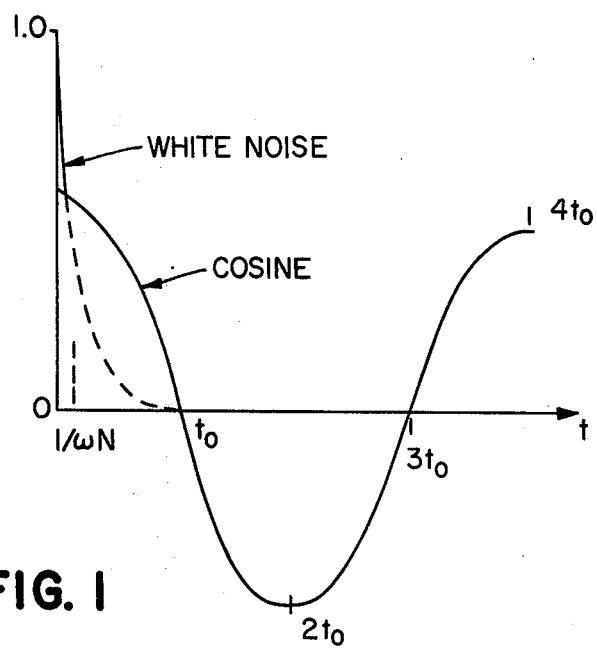
FIG. 1 is a diagrammatic representation of the autocorrelation function of a composite input signal comprising a sine wave plus white noise.

As the frequency measuring system of the present invention utilizes certain characteristics of the autocorrelation function of a composite input signal, it is useful in explaining the operation of the systems to first consider the characteristics of that function. The solid line curve of FIG. 1 represents the autocorrelation function of a composite input signal which comprises both sinusoidal components, this being the signal of interest, and substantial white noise. The ordinate of the curve is the normalized amplitude of the autocorrelation function, the highest value obtainable being unity, while the abscissa resents the variable delay $\tau$ employed in computing the degree of correlation between the two versions of the same input signal.

As is understood, the autocorrelation function of the sine wave component is itself a cosine function whereas the white noise components contribute a spike centered on the zero delay point which then tails off asymptotically toward zero amplitude for increasing delays. As is also understood, considerable information regarding the spectral content of an unknown input signal can be obtained by computing the autocorrelation function of that signal, i.e., by determining the degree of correlation between the input signal and the delayed version of itself for different delay times. With reference to the present invention, however, it is significant to note that sinusoidal components in a composite input signal tend to contribute zero crossings to the autocorrelation function whereas white noise, i.e., noise that is completely random, does not. This, of course, is a simplification but an understanding of the principle aids in understanding the operation of systems constructed in accordance with the present invention. Rather than computing entire autocorrelation functions, the systems of the present invention are devised to detect and lock onto zero crossings in the autocorrelation function by means of a feedback servo-loop which controls the delay time in an appropriate sense.

Figure 2:
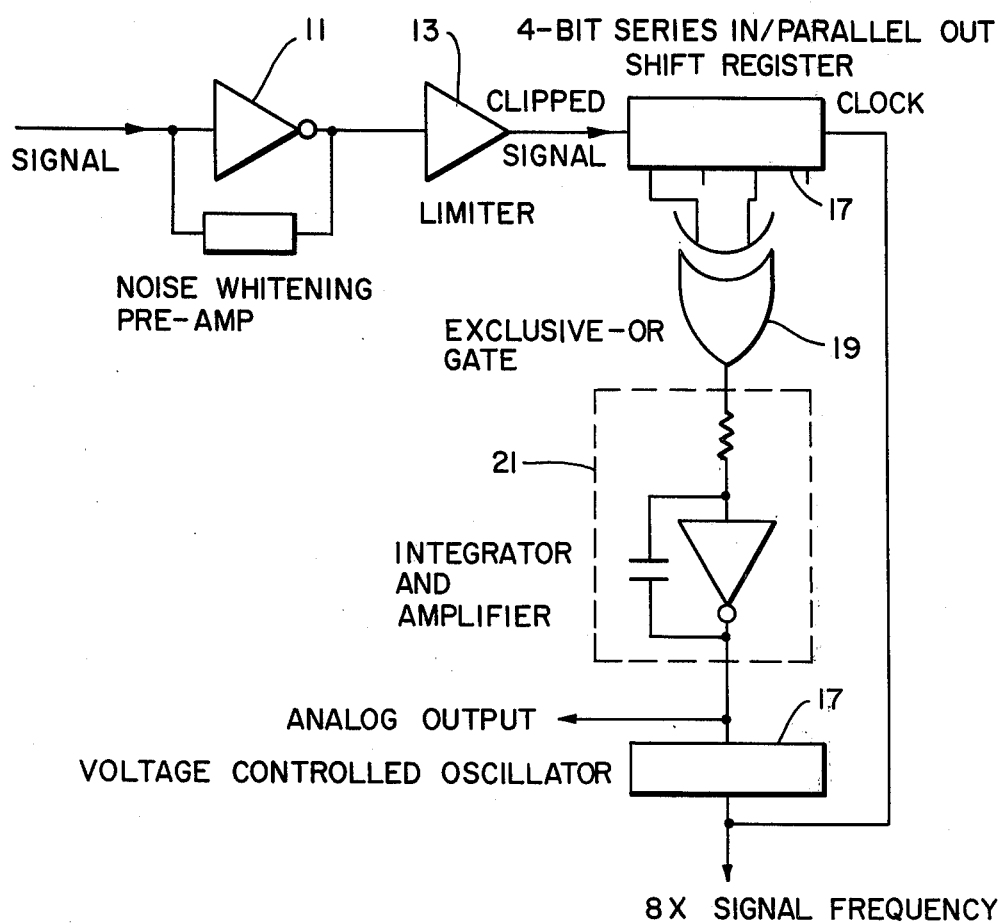
FIG. 2 is a functional diagram of a simple frequency measuring system in accordance with the present invention.

FIG. 2 represents a relatively simple system which operates by seeking and locking onto the first zero crossing in the autocorrelation function, this being a negative-going zero crossing. The input signal is applied first to a noise whitening filter 11 whose function is to assure that the noise components have an essentially uniform spectral distribution. As will be apparent hereinafter, a preponderance of low frequency noise, i.e., a "pinkening" of the noise spectrum, can somewhat adversely affect the operation of the system by introducing some offset in the measurement obtaining. The spectrally adjusted signal is then applied to a limiter 13 whose output is a hardclipped or essentially binary version of the input signal, the zero-one transitions of the binary signal corresponding essentially to the zero crossings of the analog input signal to the limiter.

The binary input signal is applied to the input terminal of a serial-in, parallel-out shift register 15. A shift register of four bits length is represented in the drawing, but this length is not highly critical so long as the sampling frequency is significantly higher than twice the highest frequency which is to be measured. In this embodiment, the signals obtained from the first and third bit positions of the shift register are used as the actual signals which are correlated, the one being a delayed function of the other with the delay being a function of the clocking rate of the shift register as well as the number of shift register stages separating the two signals. Shift register 14 is clocked by a variable frequency signal generated by a voltage controlled oscillator 17.

Comparison or correlation of these two signals is performed by an exclusive OR gate 19 which, in effect, operates as a one-bit by one-bit multiplier. The output signal from the exclusive OR gate may conveniently be termed a coincidence signal. An exclusive NOR gate might be equivalently used, i.e. a gate whose truth table is the complement of that for the exclusive OR function. Other types of logic gates might also be used and provide adequate operation, e.g. an AND gate, though the performance might suffer since logic states other than true coincidence may contribute to the output. As explained in greater detail hereinafter, the average value of this coincidence signal will correspond to the value of the autocorrelation function of the input signal for the particular value of delay then extant between the two signals being applied to the exclusive OR gate. Averaging over a selectable time interval is provided by an integrator circuit 21 to obtain an analog signal which is conveniently designated an average correlation value signal. This signal is in turn applied as a control parameter to the voltage controlled oscillator 17.

The analog control voltage obtained from the integrator circuit 21 is applied to the voltage control oscillator in a sense tending to automatically adjust the delay between the two input signals to the exclusive OR gate to a value corresponding to a negative-going zero crossing in the autocorrelation function. Thus, assuming that the time constant of the integrator is appropriately chosen, a stable servo-loop will be formed which will tend to control the clocking rate of the shift register so as to maintain the delay $\tau$ at that value corresponding to the negative zero crossing in the autocorrelation function.

Since the two input signals to the exclusive OR gate are separated by two bits along the shift register, and since the delay corresponding to this negative-going zero crossing is equal to one quarter period of the input sine wave frequency, it will be seen that the frequency of operation of the voltage controlled oscillator which will produce the desired delay in this particular embodiment is eight times the input signal frequency. This operating frequency of the voltage controlled oscillator is thus a measure of the input signal frequency once lock-on is obtained. An important distinction to be noted here, however, is that, although the voltage controlled oscillator output frequency is related to the input frequency, it is not phase locked thereto. In fact, if there is some residual d.c. offset in the system, the operating frequency of the voltage controlled oscillator will not be an exact integer multiple of the input signal. This may be contrasted with the operation of a phase locked loop where the correspondence between oscillator operating frequency and input signal frequency is necessarily integral, if lock is obtained at all.

The theory of operation can be explained in more mathematical terms as follows. The "arc-sine" law is well known. Thus, the autocorrelation function $R_o(\tau)$ of a hard-clipped function is related to the normalized autocorrelation function of the original function $R(\tau)$ by $$R_o(\tau) = 2/\pi \text{ arc sin } R(\tau)$$

Thus, the autocorrelation function of the clipped function is simply related to that of the original function and is much easier to compute. One bit shift registers can be used to generate the time delays and simple logic gates can be used for the multiplication.

Further, in order to measure the frequency of a single input signal component, it is not necessary to compute the entire autocorrelation function. Rather, one or two points can provide sufficient information if they can be located and tracked.

Finally, by appreciating that when $R_o(\tau) = 0$, then $R(\tau)$ is also zero, and the value of the time delay for the zero crossings of the autocorrelation function is unchanged by clipping the signal. Thus, one can locate the zero crossing of the clipped signal and measure its frequency with accuracy.

Considering a sinusoidal signal in the presence of noise with a power spectrum of the form $$\frac{N}{1 + (\frac{\omega}{\omega_n})^2} + S(\omega - \omega_s)$$

where $\omega_n$ and $\omega_s$ are the bandwidth of the noise and the frequency of the signal, respectively. The autocorrelation of the signal is then $$N \exp(-\omega_n \tau) + S \cos(\omega_s \tau)$$

We shall now seek the first zero crossing of $\cos(\omega_s \tau)$. However, in practice, we will measure the zero crossing of the above correlation function. The error is then $$\frac{\Delta \tau}{\tau} \approx \frac{2}{\pi} \frac{N}{S} \exp(-\pi \omega_n/2\omega_s).$$

Thus, for $$\frac{\Delta \tau}{\tau} = 1\%$$

$$\frac{\omega_n}{\omega_s} = \frac{2}{\pi} \ln\left(\frac{N}{S}\right) + 2.66.$$

Therefore, for a signal-to-noise ratio of 0 dB, the noise bandwith must be at least 2.66 times the signal frequency.

It should be noted that this theory is dependent on the noise being "white". If the noise has a large low frequency component, or is "pink", the tail of the correlation function will be increased and the accuracy of the system will be degraded. Therefore, the noise should be prewhitened by attenuating low frequency components before they enter the analyzer.

Particular Presently Preferred Embodiment

Figure 3:
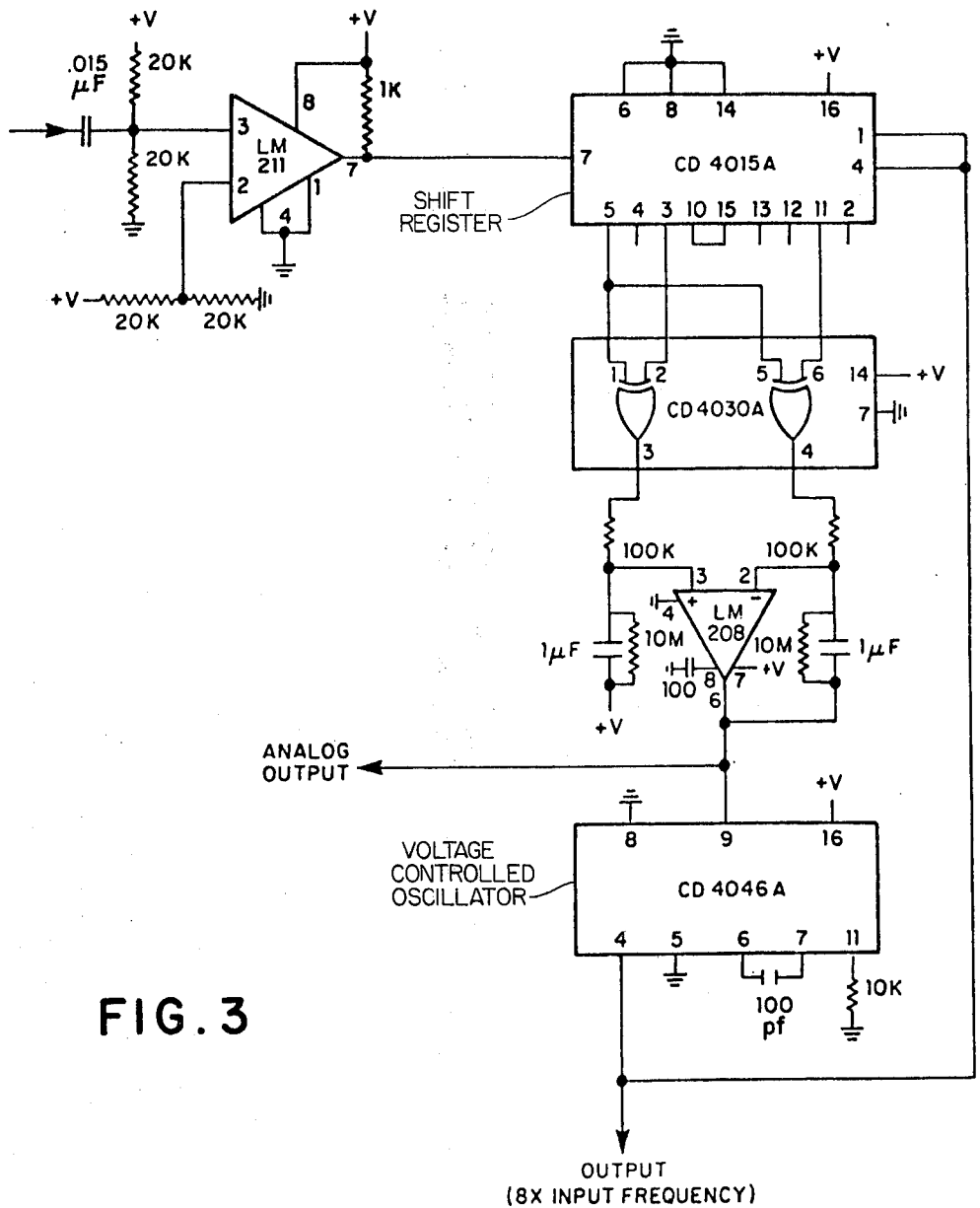
FIG. 3 is a schematic circuit diagram of a presently preferred embodiment of a frequency measuring system in accordance with the present invention.

While the autocorrelation function of the white noise components in the composite input signal is in the form of a spike centered on zero delay, the spike having skirts which tail off rapidly, there will of course be some contribution to the composite autocorrelation function at delay value corresponding to the zero crossings in the autocorrelation function of the sinusoidal input signal alone. In other words, there will be a residual d.c. component and, as noted previously, this d.c. component in the autocorrelation function can introduce an error in the measurement, just as with any other d.c. component. In the embodiment of FIG. 3, two values for the autocorrelation function of the composite input signal are generated and both are applied as inputs to drive the servo-loop control. One of the values corresponds to the negative-going zero crossing, as in the FIG. 2 embodiment, while the second value corresponds to the next zero crossing in the autocorrelation function of the sinusoidal component, this being a positive-going zero crossing. The delay corresponding to the second value will be understood to be three times the delay corresponding to the negative-going zero crossing, as may be seen from the diagram of FIG. 1. This use of two input signals inherently of opposite sign increases the accuracy both by increasing the total loop gain but also by tending to balance out any d.c. offsets, whether occurring due to the white noise contribution or to d.c. offsets occurring in the various circuit elements themselves.

In the drawing of FIG. 3, circuit elements available in integrated circuit form have been identified by their commercially accepted type designations and pin designations have also been indicated in accordance with commercial practice. Other component values have correspondingly been given. The LM211 is a comparator which squares or hard-clips the composite input signal, the d.c. and very low frequency components of the input signal being blocked by the 0.15 microfared capacitor. The CD4015A is an eight-bit serial-input, parallel-output shift register and the hard-clipped input signal is applied to the serial input of that register. The CD 4030A integrated circuit provides a pair of exclusive OR gates, each of which performs a one-bit by one-bit multiplication to obtain a respective coincidence signal. The output from the first stage of the shift register is applied as one input to each of the gates. The output from the third shift register stage is applid as the other input to one of the gates, while the output from the seventh stage of the shift register is applied to the other input of the second gate.

The LM 208 integrated circuit amplifier is connected in conventional fashion as a differential integrator circuit. The coincidence signal corresponding to the shorter delay period is applied to the positive input terminal of the integrator circuit while the coincidence signal corresponding to the longer delay period is connected to the inverting input. The capacitive feedback from the output terminal of the amplifier is also applied to this inverting input in order to obtain integration, as is understood by those skilled in the art.

The CD4046A is an integrated circuit designed for use in phase-lock loops and includes a variable frequency oscillator which is, in this particular embodiment, the only portion of this integrated circuit which is utilized. The output signal from the integrator circuit is applied as a control signal to the voltage controlled oscillator and the oscillator output frequency is applied to the clock inputs of the CD4015A shift register.

In that the coincidence signal derived from the shorter delay corresponds to a negative-going zero crossing in the autocorrelation function, while the coincidence signal derived from the longer delay corresponds to a positive-going zero crossing, and since these coincidence signals are applied to oppositely signed inputs of the differential integrator, it can be seen that these signals aid in tending to correct the frequency of the voltage controlled oscillator, i.e. so as to maintain the delays at values appropriate to the respective zero crossings.

In this particular embodiment, the delay corresponding to the first zero crossing is provided by two stages on the shift register and the longer delay is three times that, i.e. six stages along the shift register. It should be understood that, as with the previous embodiment, other delay multiples could be utilized by correspondingly scaling the oscillator frequency, e.g. three stages and nine stages or one and three stages assuming the same zero crossings were utilized. It should also be understood that, while the first negative-going and first positive-going zero crossings are believed to be best choices, other zero crossings might also be utilized if suitable precautions against ambiguity in measurement were undertaken.

As indicated previously, this particular embodiment was designed for use as a signal processor in conjunction with an optical convolution airspeed sensor. In that application, the system was found to be capable of tracking and measuring the frequency of a sinusoidal component in the input signal even though that signal frequency varied over a range of 100 to 1 and the signal to noise ratio approximately $-10$ db. An accuracy of 1% in reading was obtained even though the input signal was subject to phase reversals and phase jitter of substantial amplitude. As will be understood by those skilled in the art, conventional phase-lock loop techniques would not be readily applicable over such a wide frequency range nor be as tolerant of phase distortions.

Figure 4:
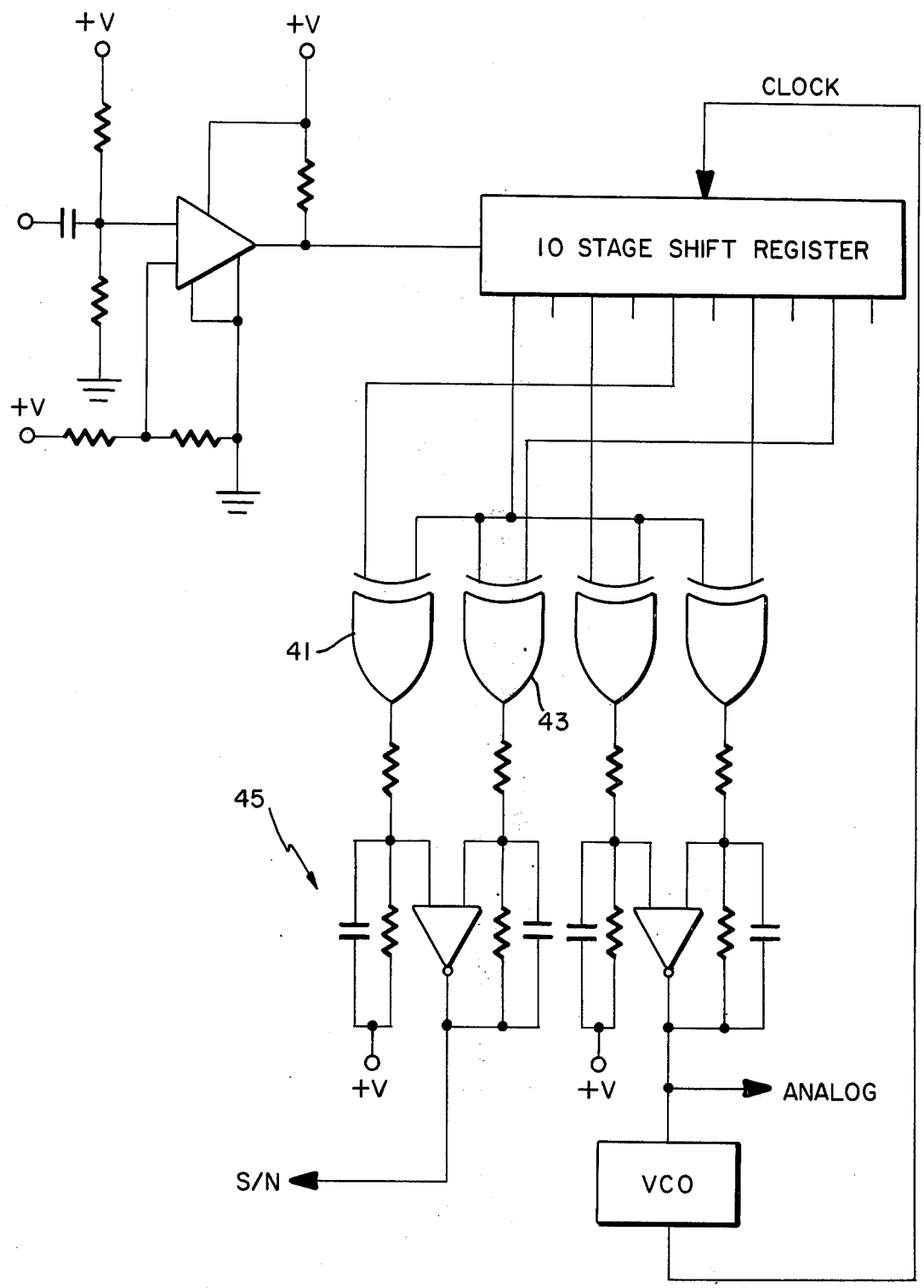
FIG. 4 is a schematic circuit diagram of a modification which provides an indication of signal to noise ratio.

If desired, an additional output signal may be derived from the signal processor of the present invention to indicate the presence of a signal whose frequency is being measured. The variation is illustrated in FIG. 4, the basic frequency measuring circuitry being essentially the same as that illustrated in FIG. 3. In the FIG. 4 circuitry, the shift register has been expanded to 10 stages and the outputs from the fifth and ninth stages have each been applied to one input of respective NAND gates 41 and 43. The output signal from the first shift register stage is applied to the other input of each of these NAND gates. The output signals from the NAND gates 41 and 43 are applid to non-inverting and inverting inputs of a second differential input integrator, designated generally by reference character 45.

When the frequency measuring portion of the circuitry is functioning, the auto correlation values measured by combining the first and third stage signals and by combining the first and sixth stage signals correspond respectively to the zero-crossings indicated at $t_0$ and $3 t_0$ in the drawing of FIG. 4. Accordingly, it can be seen that, during such operation, the autocorrelation values measured by combining the fifth stage signal with the first stage signal and by combining the ninth stage signal with the first stage signal will correspond, respectively, with the peaks indicated at $2 t_0$ and $4 t_0$ in the drawing of FIG. 1. These are maxima associated with the autocorrelation function of the relatively constant frequency component in the composite input signal.

Due to the initial clipping or hard limiting of the input signal, the amplitude of the signal obtained from the second differential input integrator 45 is not so much a measure of the amplitude of the detected signal component as it is a measure of signal to noise ratio. The presence of this signal, however, is useful in indicating that the system has acquired the desired signal component.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Apparatus for determining the frequency of a signal component in a single composite input signal, said apparatus comprising:
   means for generating a binary input signal having transitions which correspond to zero crossings in said composite input signal;
   shift register means having a plurality of stages which may be clocked at a selectable frequency;
   means for entering said binary input signal into said shift register thereby to obtain from said shift register a delayed version of said binary input signal;
   means for correlating said input signal with the delayed version thereof so as to obtain a coincidence signal which is dependent upon the value of the delay;
   means for filtering said coincidence signal to obtain an average correlation value signal;
   a controlled frequency oscillator for clocking said shift register, said average value signal being applied to control the frequency of said oscillator to vary said delay, the control being applied in a sense tending to adjust the delay to a value corresponding to a zero crossing in the autocorrelation function of said input signal whereby the frequency of operation of said oscillator will automatically adjust to correspond to the frequency of a consistent signal component in said input signal and will be relatively insensitive to the phase of said component.

2. Apparatus as set forth in claim 1 wherein said means for generating a binary signal comprises a comparator.

3. Apparatus as set forth in claim 1 wherein said means for correlating comprises an exclusive OR logic gate.

4. Apparatus as set forth in claim 1 wherein said means for obtaining an average correlation value signal comprises active integrator filter means.

5. Apparatus for determining the frequency of a signal component in a single, composite input signal, said apparatus comprising:
   means for hard-clipping the input signal to obtain a binary input signal;
   a serial-input, parallel-output shift register which may be clocked at a selectable frequency;
   means for entering said binary input signal into said shift register as the input thereto thereby to obtain, from selected outputs of said shift register, a pair of signals one of which is a delayed version of the other;
   means for correlating said pair of signals so as to obtain a coincidence signal which corresponds to the value of the autocorrelation function of the input signal for the then extant value of the delay;
   means for time averaging said coincidence signal to obtain an average correlation value signal;
   a voltage-controlled oscillator for clocking said shift register, said average value signal being applied to control the frequency of said oscillator to correspondingly vary said delay, the control being applied in a sense tending to adjust the delay to a value corresponding to a zero crossing in the autocorrelation function of said input signal, whereby the frequency of operation of said oscillator corresponds to the frequency of a signal component in said input signal and is relatively insensitive to the phase of said component.

6. Apparatus as set forth in claim 5 wherein said pair of signals are separated by two stages along said shift register.

7. Apparatus as set forth in claim 6 wherein said pair of signals are taken from the first and third stages of said shift register.

8. Apparatus as set forth in claim 5 wherein said correlation means comprises an exclusive OR logic gate.

9. Apparatus as set forth in claim 5 wherein said time averaging means comprises an integrator.

10. Apparatus for determining the frequency of a desired signal component in a composite input signal, said apparatus comprising: means for hard cliping the input signal to obtain a binary input signal;
   a serial-input, parallel-output shift register which may be clocked at a selectable frequency;
   means for entering said binary input signal into said shift register as the input thereto thereby to obtain, from selected outputs of said shift register, a first pair of signals one of which is a delayed version of the other and a second pair of signals one of which is a delayed version of the other, the delay between said first pair of signals corresponding to a negative-going zero crossing in the autocorrelation function of said desired input signal component and the delay between said second pair of signals corresponding to a positive-going zero crossing in the autocorrelation function of said desired input signal component;
   means for correlating said first pair of signals so as to obtain a first coincidence signal which corresponds to the value of the autocorrelation function of the input signal for the then extant value of the delay between the first pair of signals;
   means for correlating said second pair of signals so as to obtain a second coincidence signal which corresponds to the value of the autocorrelation function of the input signal for the then extant value of the delay between the second pair of signals;
   a differential input integrator circuit, one of said coincidence signals being applied to one of the integrator inputs and the other coincidence signal being applied to the other integrator input thereby to obtain from the integrator circuit an average correlation value signal;
   a voltage-controlled oscillator for clocking said shift register, said average value signal being applied to control the frequency of said oscillator to correspondingly vary said delays, whereby the frequency of operation of said oscillator corresponds to the frequency of said desired input signal component and is relatively insensitive to the phase of said component.

11. Apparatus as set forth in claim 10 wherein said second delay is three times said first delay.

12. Apparatus as set forth in claim 10 wherein said correlating means are exclusive OR gates.

13. Apparatus as set forth in claim 10 wherein one of said first pair of signals is taken from the first stage of said shift register and the other is taken from the third stage of said shift register and wherein one said second pair of signals is taken from the first stage of said shift register and the other is taken from the seventh stage.

14. Apparatus as set forth in claim 10 further comprising: means for obtaining from said shift register a third pair of signals, one of which is a delayed version of the other and a fourth pair of signals, one of which is delayed version of the other, the delay between said third pair of signals corresponding to a negtive peak in the autocorrelation function of said desired input signal component and the delay between said fourth pair of signals corresponding to a positive peak in the autocorrelation function of said desired input signal component;
   means for correlating said third pair of signals so as to obtain a third coincidence signal;
   means for correlating said fourth pair of signals so as to obtain a fourth coincidence signal; and
   a second differential input integrator circuit, said third and fourth coincidence signals being applied to the inputs of said second integrator circuit whereby the output signal provided by said second integrator circuit as indicative of the presence of said desired signal component.

15. Apparatus as set forth in claim 14 wherein one of said first pair of signals is taken from the third shift register stage, wherein one of said second pair of signals is taken from the seventh shift register stage, wherein one of said third pair of signals is taken from the fifth shift register stage, wherein one of said fourth pair of signals is taken from the ninth shift register stage and wherein the other of each pair of signals is taken from the first shift register stage.

16. Apparatus as set forth in claim 9 further comprising:
   means for obtaining from said shift register a second pair of signals, one of which is a delayed version of the other, the delay between said second pair of signals corresponding to a peak in the autocorrelation function of said desired input signal component;
   means for correlating said second pair of signals so as to obtain a second coincidence signal; and
   a second integrator circuit, said second coincidence signal being applied to the input of said second integrator circuit whereby the output signal provided by said second integrator circuit is indicative of the presence of said desired signal component.

17. Apparatus for determining the frequency of a sinusoidal signal component in a composite input signal, said apparatus comprising:

means for hard clipping the input signal to obtain a binary input signal;

a serial-input, parallel-output shift register which may be clocked at a selectable freuency;

means for entering said binary input signal into said shift register as the input thereto thereby to obtin, from selected outputs of said shift register, a first pair of signals one of which is a delayed version of the other and second pair of signals one of which is a delayed version of the other, the delay between said second pair of signals being three times the delay between said first pair;

means for correlating said first pair of signals so as to obtain a first coicidence signal which corresponds to the value of the autocorrelation function of the input signal for the then extant value of the delay between the first pair of signals;

means for correlating said second pair of signals so as to obtain a second coincidence signal which corresponds to the value of the autocorrelation function of the input signal for the then extant value of the delay between the second pair of signals;

a differential input integrator circuit, one of said coincidence signals being applied to one of the integrator inputs and the other coincidence signal being pplied to the other integrator input thereby to obtin from the integrator circuit an average correlation value signal;

a voltage-controlled oscillator for clocking said shift register, said average value signal being applied to control the freuency of said oscillator to correspondingly vary said delays, the control being applied in a sense tending to adjust the first delay to a value corresponding to a negative-going zero crossing in the autocorrelation function of said input signal and the second delay to a value corresponding to a positive-going zero crossing in the autocorrelation function, whereby the frequency of operation of said oscillator corresponds to the frequency of a signal component in said input signal and is relatively insensitive to the phase of said component.

* * * * *